United States Patent
Shi et al.

(10) Patent No.: US 11,692,110 B2
(45) Date of Patent: *Jul. 4, 2023

(54) LOW OXIDE TRENCH DISHING CHEMICAL MECHANICAL POLISHING

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/353,236

(22) Filed: Jun. 21, 2021

(65) Prior Publication Data
US 2021/0309885 A1    Oct. 7, 2021

Related U.S. Application Data

(62) Division of application No. 16/450,732, filed on Jun. 24, 2019, now Pat. No. 11,072,726.

(60) Provisional application No. 62/692,639, filed on Jun. 29, 2018, provisional application No. 62/692,633, filed on Jun. 29, 2018.

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

| | | |
|---|---|---|
| 5,028,620 A | 7/1991 | Hsu |
| 5,876,490 A | 3/1999 | Ronay |
| 6,544,892 B2 | 4/2003 | Srinivasan et al. |
| 6,616,514 B1 | 9/2003 | Edelbach et al. |

(Continued)

FOREIGN PATENT DOCUMENTS

| | | |
|---|---|---|
| CN | 103210047 A | 7/2013 |
| KR | 20160079328 | 7/2016 |

(Continued)

OTHER PUBLICATIONS

The China National Intellectual Property Administration; Patent Search Report; Application No. 2022103510496; dated Dec. 29, 2022.

*Primary Examiner* — Roberts P Culbert
(74) *Attorney, Agent, or Firm* — Lina Yang

(57) ABSTRACT

Chemical mechanical planarization (CMP) polishing compositions, methods and systems are provided to reduce oxide trench dishing and improve over-polishing window stability. High and tunable silicon oxide removal rates, low silicon nitride removal rates, and tunable $SiO_2$:SiN selectivity are also provided. The compositions use a unique combination of abrasives such as ceria coated silica particles and chemical additives such as maltitol, lactitol, maltotritol or combinations as oxide trench dishing reducing additives.

5 Claims, 12 Drawing Sheets

(56) References Cited

U.S. PATENT DOCUMENTS

| | | | |
|---|---|---|---|
| 6,964,923 | B1 | 11/2005 | Ronay |
| 2012/0077419 | A1 | 3/2012 | Zhang |
| 2013/0200039 | A1 | 8/2013 | Noller et al. |
| 2013/0248756 | A1 | 9/2013 | Venkataraman |
| 2019/0211245 | A1* | 7/2019 | Choi .................... C09K 3/1436 |

FOREIGN PATENT DOCUMENTS

| | | |
|---|---|---|
| WO | 2006001558 A1 | 1/2006 |
| WO | 2012032461 A1 | 3/2012 |

* cited by examiner

LOW OXIDE TRENCH DISHING CHEMICAL MECHANICAL POLISHING

CROSS REFERENCE TO RELATED PATENT APPLICATIONS

The application is a divisional application of U.S. application Ser. No. 16/450,732 filed on September Jun. 24, 2019 which claims the benefit of priority under 35 U.S.C. § 119(e) to earlier filed U.S. patent application Ser. Nos. 62/692,633, and 62/692,639 filed on Jun. 29, 2018, which are entirely incorporated herein by reference.

BACKGROUND OF THE INVENTION

This invention relates to the chemical mechanical planarization (CMP) for polishing oxide and doped oxide films.

In the fabrication of microelectronics devices, an important step involved is polishing, especially surfaces for chemical-mechanical polishing for the purpose of recovering a selected material and/or planarizing the structure.

For example, a SiN layer is deposited under a $SiO_2$ layer to serve as a polish stop. The role of such polish stop is particularly important in Shallow Trench Isolation (STI) structures. Selectivity is characteristically expressed as the ratio of the oxide polish rate to the nitride polish rate. An example is an increased polishing selectivity rate of silicon dioxide ($SiO_2$) as compared to silicon nitride (SiN).

In the global planarization of patterned structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876, 490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

However, the importance of oxide trench dishing reducing has not been addressed in the STI CMP polishing process.

It should be readily apparent from the foregoing that there remains a need within the art for compositions, methods and systems of chemical mechanical polishing that can afford the reduced oxide trench dishing and improved over polishing window stability in a chemical and mechanical polishing (CMP) process, in addition to high removal rate of silicon dioxide as well as high selectivity for silicon dioxide to silicon nitride.

BRIEF SUMMARY OF THE INVENTION

The present invention provides Chemical mechanical polishing (CMP) compositions, methods and systems in CMP applications for polishing oxide.

The present invention provides the benefits of achieving high oxide film removal rates, low SiN film removal rates, high and tunable Oxide:SiN selectivity, lower total defect counts post-polishing, excellent mean particle size (nm) stability, and importantly, significantly reducing oxide trench dishing and improving over polishing window stability.

In one aspect, there is provided a CMP polishing composition comprises:

abrasive particles selected from the group consisting of ceria-coated inorganic metal oxide particles, ceria-coated organic polymer particles, and combinations thereof;

chemical additive as oxide trenching dishing reducer, a solvent; and optionally biocide; and pH adjuster;

wherein the composition has a pH of 2 to 12, preferably 3 to 10, and more preferably 4 to 9.

The ceria-coated inorganic metal oxide particles include, but are not limited to, ceria-coated colloidal silica, ceria-coated high purity colloidal silica, ceria-coated alumina, ceria-coated titania, ceria-coated zirconia, or any other ceria-coated inorganic metal oxide particles.

The ceria-coated organic polymer particles include, but are not limited to, ceria-coated polystyrene particles, ceria-coated polyurethane particle, ceria-coated polyacrylate particles, or any other ceria-coated organic polymer particles.

The preferred abrasive particles are ceria-coated inorganic metal oxide particles; more preferred abrasive particles are ceria-coated silica particles.

The solvent includes but is not limited to deionized (DI) water, distilled water, and alcoholic organic solvents.

The chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The chemical additives as oxide trenching dishing reducers contain at least two, at least four, or at least six hydroxyl functional groups in their molecular structures.

The general molecular structure for the chemical additives is shown in (a):

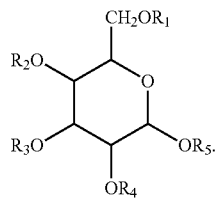
(a)

In one embodiment, at least one R in the group of R1 to R5 in the general molecular structure is a polyol molecular unit having a structure shown in (b):

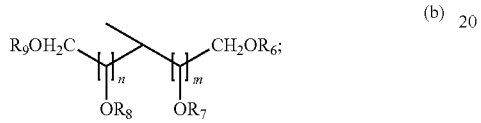
(b)

wherein n and m can be the same or different. m or n is independently selected from 1 to 5, preferably from 1 to 4, more preferably from 1 to 3, and most preferably from 1 to 2. R6 to R9 can be the same or different atoms or functional groups and each is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In another embodiment, at least one R in the group of R1 to R5 in the general molecular structure is a polyol molecular unit having a structure shown in (b); at least one R in the group of R1 to R5 in the general molecular structure is a six-member ring polyol as shown in (c):

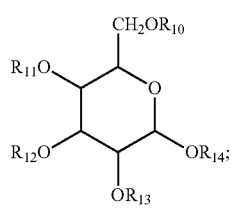
(c)

wherein each of R10, R11, R12, R13 and R14 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In the general molecular structure, at least two, preferably four, more preferably six of the Rs in the group of R1 to R9 are hydrogen atoms.

When only one R, such as R5 in the group of R1 to R5 in the general molecular structure is a polyol molecular unit (b) having n=2 and m=1; and all rest of Rs in the group of R1 to R9 are all hydrogen atoms, the following two chemical additives are obtained:

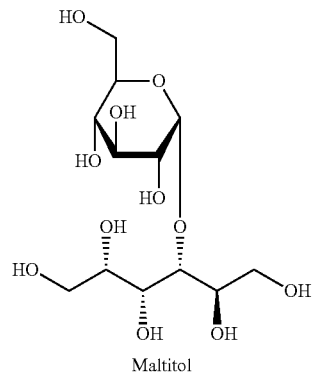
Maltitol

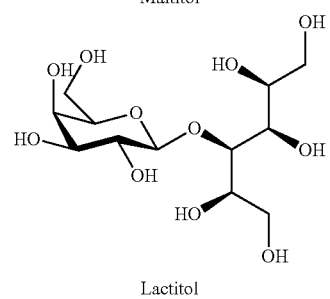
Lactitol

When one R, such as R5 is a polyol molecular unit (b) having n=2 and m=1; and one R, such as R2 is a six-member ring polyol; and all rest of Rs in the group of R1 to R14 are all hydrogen atoms, the following chemical additive is obtained:

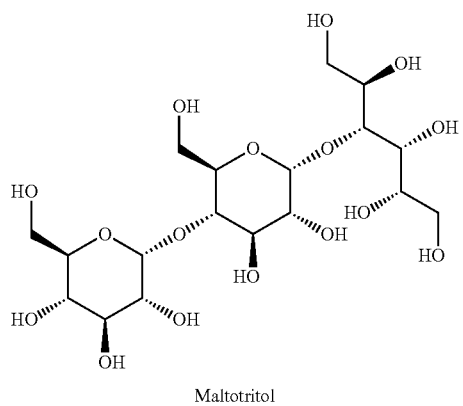 [SMILES: OC[C@@H](O)[C@@H](O[C@H]1O[C@H](CO)[C@@H](O[C@H]2O[C@H](CO)[C@@H](O)[C@H](O)[C@H]2O)[C@H](O)[C@H]1O)[C@H](O)[C@@H](O)CO]
Maltotritol

The preferred chemical additive comprises maltitol, lactitol, maltotritol, and combinations.

In some embodiments, the CMP polishing composition can be made into two or more parts and mixed at the point of use.

In another aspect, there is provided a method of chemical mechanical polishing (CMP) a substrate having at least one surface comprising silicon dioxide (such tetraethyl orthosilicate or TEOS) using the chemical mechanical polishing (CMP) composition described above.

In yet another aspect, there is provided a system of chemical mechanical polishing (CMP) a substrate having at least one surface comprising silicon dioxide using the chemical mechanical polishing (CMP) composition described.

The polished oxide films can be Chemical vapor deposition (CVD), Plasma Enhance CVD (PECVD), High Density Deposition CVD (HDP), or spin on oxide films.

The substrate disclosed above can further comprises a silicon nitride (SiN) surface. The removal selectivity of $SiO_2$:SiN is greater than 10, preferably greater than 20, and more preferably greater than 30.

DETAILED DESCRIPTION OF THE INVENTION

Figure 1:
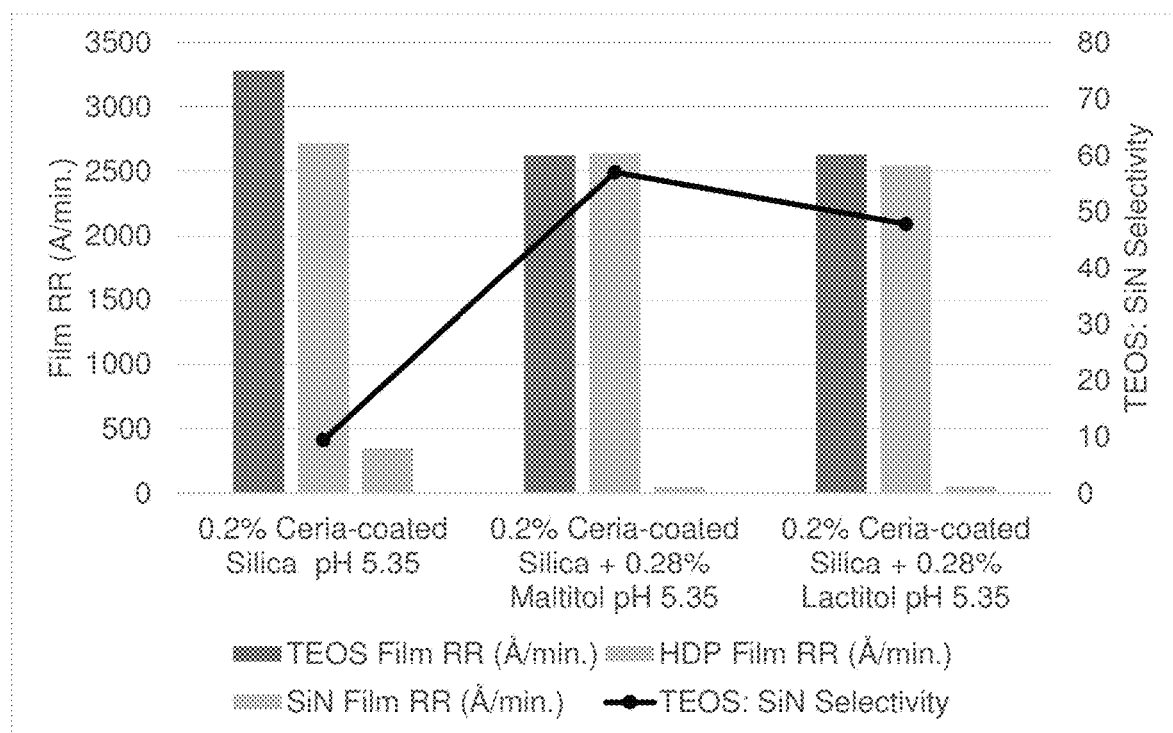
FIG. 1 depicts the effects of Maltitol or Lactitol on Film RR (Å/min.) & TEOS:SiN Selectivity

This invention relates to the Chemical mechanical polishing (CMP) compositions, methods and systems for CMP applications polishing oxide and doped oxide films.

In the global planarization of patterned structures, reducing oxide trench dishing is a key factor to be considered. The lower trench oxide loss will prevent electrical current leaking between adjacent transistors. Non-uniform trench oxide loss across die or/and within Die will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in CMP polishing compositions.

The CMP compositions comprise the unique combination of abrasive and the suitable chemical additives.

This invention provides a reduced oxide trench dishing and thus improved over polishing window stability by introducing chemical additives as oxide trench dishing reducing additives in the Chemical mechanical polishing (CMP) compositions at wide pH range including acidic, neutral and alkaline pH conditions.

The Chemical Mechanical Polishing (CMP) compositions provide high oxide film removal rates, low SiN film removal rates and high $SiO_2$:SiN selectivity.

The Chemical Mechanical Polishing (CMP) composition also further provides excellent mean particle size and size distribution stability for the abrasive particles which is very important in maintaining robust CMP polishing performances with minimized polishing performance variations.

In one aspect, there is provided a CMP polishing composition comprises:

abrasive particles selected from the group consisting of ceria-coated inorganic metal oxide particles, ceria-coated organic polymer particles, and combinations thereof;

chemical additives as oxide trenching dishing and total defect count reducers;

a solvent; and optionally biocide; and pH adjuster;

wherein the composition has a pH of 2 to 12, preferably 3 to 10, and more preferably 4 to 9.

The ceria-coated inorganic metal oxide particles include, but are not limited to, ceria-coated colloidal silica, ceria-coated high purity colloidal silica, ceria-coated alumina, ceria-coated titania, ceria-coated zirconia, or any other ceria-coated inorganic metal oxide particles.

The ceria-coated organic polymer particles include, but are not limited to, ceria-coated polystyrene particles, ceria-coated polyurethane particle, ceria-coated polyacrylate particles, or any other ceria-coated organic polymer particles.

The average mean particle sizes or mean particle sizes (MPS) abrasive particles in the disclosed invention herein are ranged from 2 to 1,000 nm, 5 to 500 nm, 15 to 400 nm or 25 to 250 nm. MPS refers to diameter of the particles and is measured using dynamic light scattering (DLS) technology.

The concentrations of abrasive particles range from 0.01 wt. % to 20 wt. %, 0.05 wt. % to 10 wt. %, or 0.1 wt. % to 5 wt. %.

The preferred abrasive particles are ceria-coated inorganic metal oxide particles; more preferred abrasive particles are ceria-coated silica particles.

The solvent includes but is not limited to deionized (DI) water, distilled water, and alcoholic organic solvents.

The preferred solvent is DI water.

The CMP slurry may contain biocide from 0.0001 wt. % to 0.05 wt. %; 0.0005 wt. % to 0.025 wt. %, or 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one 2-methyl-4-isothiazolin-3-one.

The CMP slurry may contain a pH adjusting agent.

An acidic or basic pH adjusting agent can be used to adjust the polishing compositions to the optimized pH value.

The acidic pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The CMP slurry contains 0 wt. % to 1 wt. %; 0.01 wt. % to 0.5 wt. %; or 0.1 wt. % to 0.25 wt. % pH adjusting agent.

The CMP slurry contains 0.01 wt. % to 20 wt. %, 0.025 wt. % to 10 wt. %, 0.05 wt. % to 5 wt. %, or 0.1 to 3.0% wt. % of the chemical additives as oxide trenching dishing and total defect count reducers.

The chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The chemical additives as oxide trenching dishing reducers contain at least two, at least four, or at least six hydroxyl functional groups in their molecular structures.

The general molecular structure for the chemical additives is shown in (a):

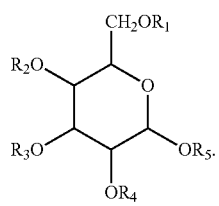

(a)

In one embodiment, at least one R in the group of R1 to R5 in the general molecular structure is a polyol molecular unit having a structure shown in (b):

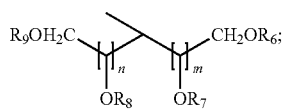

(b)

wherein n and m can be the same or different. m or n is independently selected from 1 to 5, preferably from 1 to 4, more preferably from 1 to 3, and most preferably from 1 to 2; R6 to R9 can be the same or different atoms or functional groups; and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In another embodiment, at least one R in the group of R1 to R5 in the general molecular structure is a polyol molecular unit having a structure shown in (b); at least one R in the group of R1 to R5 in the general molecular structure is a six-member ring polyol as shown in (c):

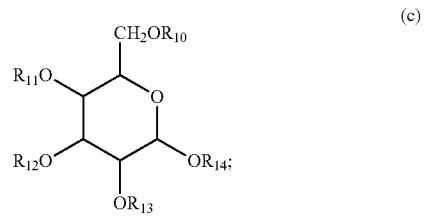

(c)

wherein each of R10, R11, R12, R13 and R14 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;

and the rest of Rs in the group of R1 to R5 can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

In the general molecular structure, at least two, preferably four, more preferably six of the Rs in the group of R1 to R9 are hydrogen atoms.

When only one R, such as R5 in the group of R1 to R5 in the general molecular structure is a polyol molecular unit (b) having n=2 and m=1; and all rest of Rs in the group of R1 to R9 are all hydrogen atoms, the following two chemical additives are obtained:

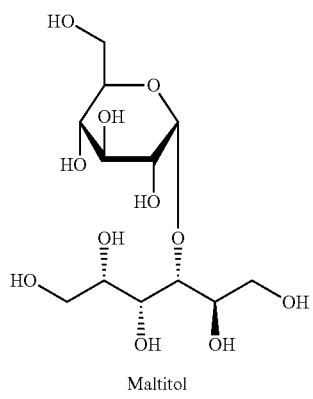

Maltitol

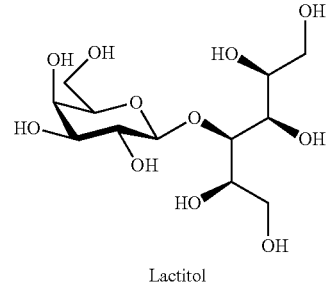

Lactitol

When one R, such as R5 is a polyol molecular unit (b) having n=2 and m=1; and one R, such as R2 is a six-member ring polyol; and all rest of Rs in the group of R1 to R14 are all hydrogen atoms, the following chemical additive is obtained:

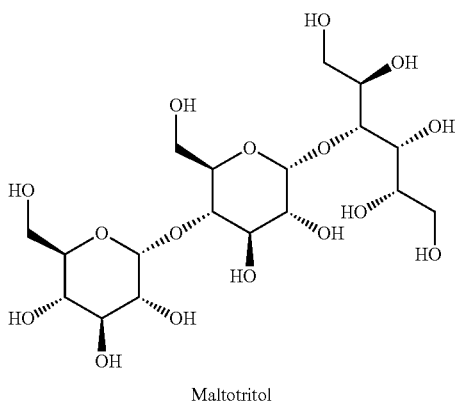 [SMILES: OC[C@@H](O)[C@@H](O[C@H]1O[C@H](CO)[C@@H](O[C@H]2O[C@H](CO)[C@@H](O)[C@H](O)[C@H]2O)[C@H](O)[C@H]1O)[C@H](O)[C@@H](O)CO]

Maltotritol

The preferred chemical additive comprises maltitol, lactitol, maltotritol, and combinations.

In some embodiments, the CMP polishing compositions can be made into two or more parts and mixed at the point of use.

In another aspect, there is provided a method of chemical mechanical polishing (CMP) a substrate having at least one surface comprising silicon dioxide using the chemical mechanical polishing (CMP) composition described.

In yet another aspect, there is provided a system of chemical mechanical polishing (CMP) a substrate having at least one surface comprising silicon dioxide using the chemical mechanical polishing (CMP) composition described.

The polished oxide films can be Chemical vapor deposition (CVD), Plasma Enhance CVD (PECVD), High Density Deposition CVD (HDP), spin on oxide films, flowable CVD oxide film, carbon doped oxide film, or nitrogen doped oxide film.

The substrate disclosed above can further comprises a silicon nitride surface. The removal selectivity of $SiO_2$:SiN is greater than 10, preferably greater than 20, and more preferably greater than 30.

Dishing performance of the CMP compositions can also be characterized by the ratio of oxide trench dishing rate (Å/min.) vs the blanket HDP film removal rate (Å/min.). The smaller of this ratio is, the lower oxide trench dishing is. The CMP compositions having the ratio of 0.1, 0.08, 0.06, 0.05, 0.03, or 0.02 provide good oxide dishing performance.

In CMP polishing compositions, it is very important to keep abrasive particles stable to assure consistent desired CMP polishing performance.

When using the chemical additives in the CMP polishing compositions, these chemical additives can have some impacts on the stability of abrasive particles in the compositions.

For example, when maltitol, lactitol or their derivatives, are used as oxide trench reducing agents in polishing compositions, these chemical additives can have some impacts on the stability of ceria-coated inorganic oxide abrasives in the CMP polishing compositions.

Typically, the abrasive particle stability is tested by monitoring the mean particle size (MPS) (nm) and particle size distribution parameter D99 (nm) changes vs the times or at elevated temperatures.

Particle size distribution may be quantified as a weight percentage of particles that has a size lower than a specified size. For example, parameter D99 (nm) represents a particle size (diameter) where 99 wt. % of all the slurry particles would have particle diameter equal to or smaller than the D99 (nm). That is, D99 (nm) is a particle size that 99 wt. % of the particles fall on and under.

The smaller of MPS (nm) and D99 (nm) changes, the more stable of the abrasive particles are and thus the CMP polishing compositions are.

Particle size distribution can be measured by any suitable techniques such as imaging, dynamic light scattering, hydrodynamic fluid fractionation, disc centrifuge etc.

MPS (nm) and D99 (nm) are both measured by dynamic light scattering in this application.

CMP compositions providing abrasive particle stability have the changes for MPS (nm) and D99 (nm)≤6.0%, 5.0%, 3.0%, 2.0%, 1.0%, 0.5%, 0.3% or 0.1% for a shelf time of at least 30 days, 40 days, 50 days, 60 days, 70 days or 100 days at a temperature ranging from 20 to 60° C., 25 to 50° C.

The following non-limiting examples are presented to further illustrate the present invention.

CMP Methodology

In the examples presented below, CMP experiments were run using the procedures and experimental conditions given below.

Glossary

Components

Ceria-coated Silica: used as abrasive having a mean particle size ranged from approximately 20 nanometers (nm) to 500 nanometers (nm).

Ceria-coated Silica particles (with varied sizes) were supplied by JGC Inc. in Japan.

Chemical additives, such as maltitol, lactitol and other chemical raw materials were supplied by Sigma-Aldrich, St. Louis, Mo.

TEOS: tetraethyl orthosilicate

Polishing Pad: Polishing pad, 101010 and other pads were used during CMP, supplied by DOW, Inc.

Parameters

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
Wt. %: weight percentage (of a listed component)
TEOS: SiN Selectivity: (removal rate of TEOS)/(removal rate of SiN)
HDP: high density plasma deposited TEOS
TEOS or HDP Removal Rates: Measured TEOS or HDP removal rate at a given down pressure. The down pressure of the CMP tool was 2.0, 3.0 or 4.0 psi in the examples.

SiN Removal Rates: Measured SiN removal rate at a given down pressure. The down pressure of the CMP tool was 3.0 psi in the examples.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An IC1000 pad supplied by DOW, Inc, 451 Bellevue Rd., Newark, Del. 19713 was used on platen 1 for blanket and pattern wafer studies.

The 101010 pad or other pad was broken in by conditioning the pad for 18 mins. At 7 lbs. down force on the conditioner. To qualify the tool settings and the pad break-in two tungsten monitors and two TEOS monitors were polished with Versum® STI2305 slurry, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm; head speed: 93 rpm; membrane pressure: 3.0 psi; inter-tube pressure: 3.1 psi; retaining ring pressure: 5.1 psi; slurry flow speed: 200 ml/min.

The slurry was used to polish the patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

TEOS: SiN Selectivity: (removal rate of TEOS)/(removal rate of SiN) obtained from the CMP polishing compositions were tunable.

WORKING EXAMPLES

In the following working examples, a reference (ref.) polishing composition comprising 0.2 wt. % ceria-coated silica, a biocide ranging from 0.0001 wt. % to 0.05 wt. %, and deionized water was prepared.

The polishing compositions were prepared with the reference (0.2 wt. % ceria-coated silica, a biocide ranging from 0.0001 wt. % to 0.05 wt. %, and deionized water) and a chemical additive ranging from 0.01 wt. % to 2.0% wt. %.

All compositions in the examples, except compositions used in different pH condition example had a pH at 5.35.

pH adjusting agent used for acidic pH condition and alkaline pH condition were nitric acid and ammonium hydroxide respectively.

Example 1

In Example 1, the polishing compositions were prepared as shown in Table 1. The chemical additives, maltitol or lactitol were used at 0.28 wt. % respectively.

The removal rates (RR at Å/min) for different films were tested. The effects of two selected chemical additives, maltitol and lactitol on the film removal rates and selectivity were observed.

The test results were listed in Table 1 and shown in FIG. 1.

TABLE 1

Effects of Maltitol or Lactitol on Film RR (Å/min.) & TEOS:SiN Selectivity

| Compositions | TEOS Film RR (Å/min.) | HDP Film RR (Å/min.) | SiN Film RR (Å/min.) | TEOS:SiN Selectivity |
|---|---|---|---|---|
| 0.2% Ceria-coated Silica pH 5.35 | 3279 | 2718 | 349 | 9.4 |
| 0.2% Ceria-coated Silica + 0.28% Maltitol pH 5.35 | 2623 | 2639 | 46 | 57.0 |
| 0.2% Ceria-coated Silica + 0.28% Lactitol pH 5.35 | 2630 | 2547 | 55 | 47.8 |

As the results shown in Table 1 and FIG. 1, the addition of the chemical additives, maltitol or lactitol, in the polishing compositions, significantly suppressed SiN removal rates while still afforded high TEOS and HDP film removal rates, thus, significantly increased Oxide: SiN film polishing selectivity.

Example 2

In Example 2, the polishing composition were prepared as shown in Table 2. The chemical additives, maltitol or lactitol were used at 0.28 wt. % respectively. All samples had a pH at 5.35.

Oxide trenching dishing for without/or with different over polishing times were tested.

The effects of maltitol or lactitol on the oxide trenching dishing vs over polishing times were observed.

Figure 2:
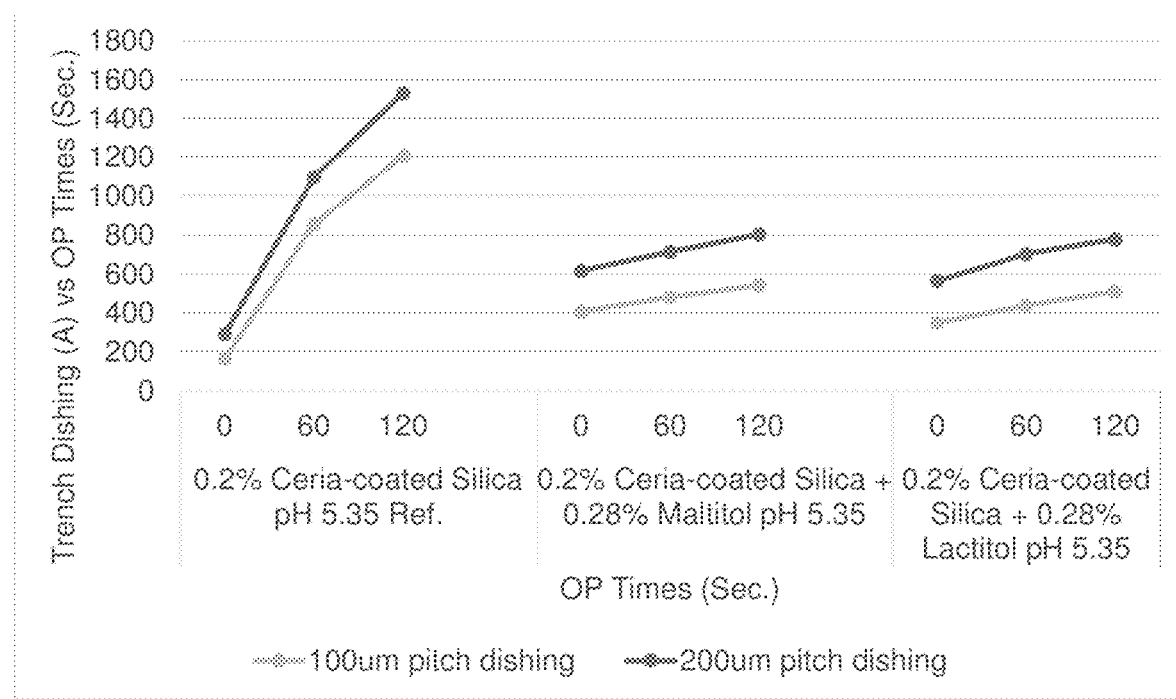
FIG. 2 depicts the effects of Maltitol or Lactitol on Oxide Trench Dishing vs OP Times (Sec.)

The test results were listed in Table 2 and shown in FIG. 2.

TABLE 2

Effects of Maltitol or Lactitol on Oxide
Trench Dishing vs OP Times (Sec.)

| Compositions | OP Times (Sec.) | 100 um pitch dishing | 200 um pitch dishing |
|---|---|---|---|
| 0.2% Ceria-coated Silica pH 5.35 Ref. | 0 | 165 | 291 |
|  | 60 | 857 | 1096 |
|  | 120 | 1207 | 1531 |
| 0.2% Ceria-coated Silica + 0.28% Maltitol pH 5.35 | 0 | 408 | 616 |
|  | 60 | 480 | 713 |
|  | 120 | 542 | 803 |
| 0.2% Ceria-coated Silica + 0.28% Lactitol pH 5.35 | 0 | 349 | 563 |
|  | 60 | 438 | 702 |
|  | 120 | 510 | 779 |

As the results shown in Table 2 and FIG. 2, the polishing compositions with the addition of the chemical additives, maltitol or lactitol, afforded low oxide trench dishing on 100 um pitch, and 200 um pitch respectively when 60 second or 120 second over polishing (OP) times were applied.

The compositions provided significant oxide trench dishing reductions comparing to the reference polishing composition which did not have the chemical additives, maltitol or lactitol.

Table 3 listed the ratio of oxide trench dishing rate (Å/min.) vs the blanket HDP film removal rate (Å/min.).

TABLE 3

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica pH 5.35 | 0.13 | 0.16 |
| 0.2% Ceria-coated Silica + 0.28% Maltitol pH 5.35 | 0.02 | 0.03 |
| 0.2% Ceria-coated Silica + 0.28% Lactitol pH 5.35 | 0.03 | 0.03 |

As the results shown in Table 3, the addition of either maltitol or lactitol as oxide trench dishing reducer in polishing compositions significantly reduced the ratio of trench dishing rate vs the blanket HDP film removal rates. The lower of this ratio is, the lower of oxide trench dishing is.

Figure 3:
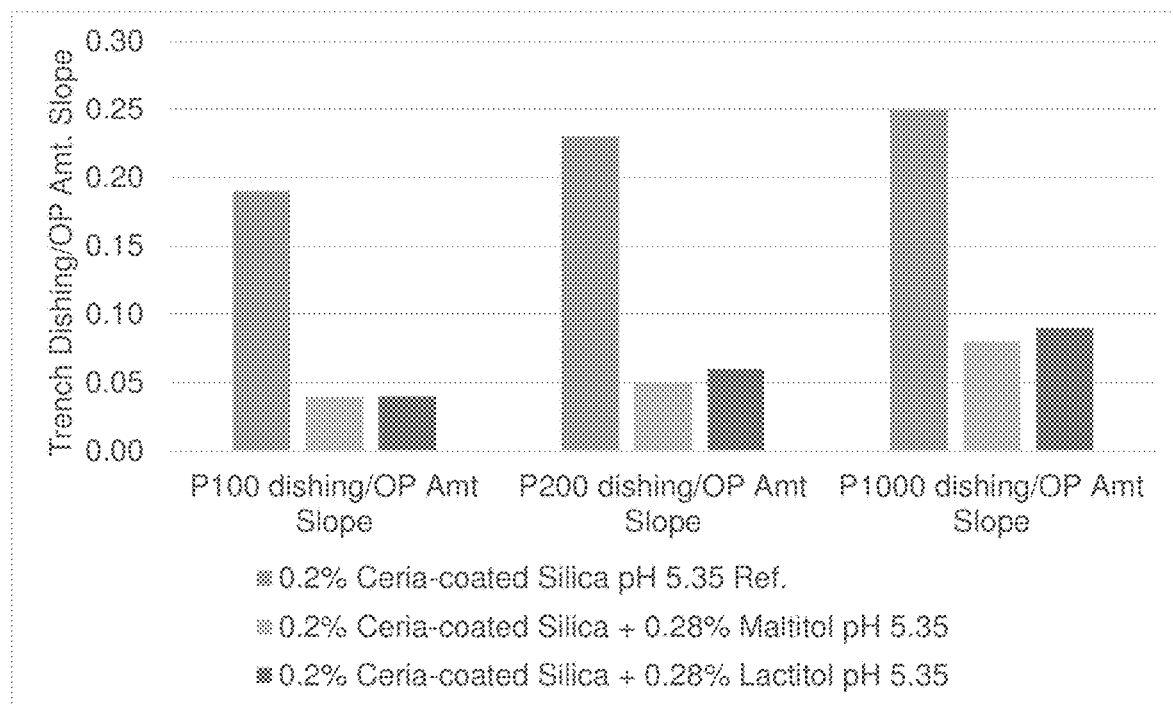
FIG. 3 depicts the effects of Maltitol or Lactitol on Slopes of Dishing vs OP Removal Amount

The slopes of oxide trench dishing vs the OP removal amount was showed in Table 4 and FIG. 3.

The results listed in Table 4 and FIG. 3 indicated that the compositions with chemical additives, maltitol or lactitol provided lower slopes which indicated good over polishing window for maintaining low oxide trench dishing even more oxide film removed in over polishing steps.

TABLE 4

Effects of Maltitol or Lactitol on Slopes
of Dishing vs OP Removal Amount

| Compositions | P100 dishing/OP Amt Slope | P200 dishing/OP Amt Slope | P1000 dishing/OP Amt Slope |
|---|---|---|---|
| 0.2% Ceria-coated Silica pH 5.35 Ref. | 0.19 | 0.23 | 0.25 |
| 0.2% Ceria-coated Silica + 0.28% Maltitol pH 5.35 | 0.04 | 0.05 | 0.08 |
| 0.2% Ceria-coated Silica + 0.28% Lactitol pH 5.35 | 0.04 | 0.06 | 0.09 |

As showing in Table 4 and FIG. 3, the CMP polishing compositions comprising chemical additives such as maltitol or lactitol, and ceria-coated silica again showed much lower slope values comparing to those slope values obtained for the ceria-coated silica abrasive based reference sample.

Example 3

Figure 4:
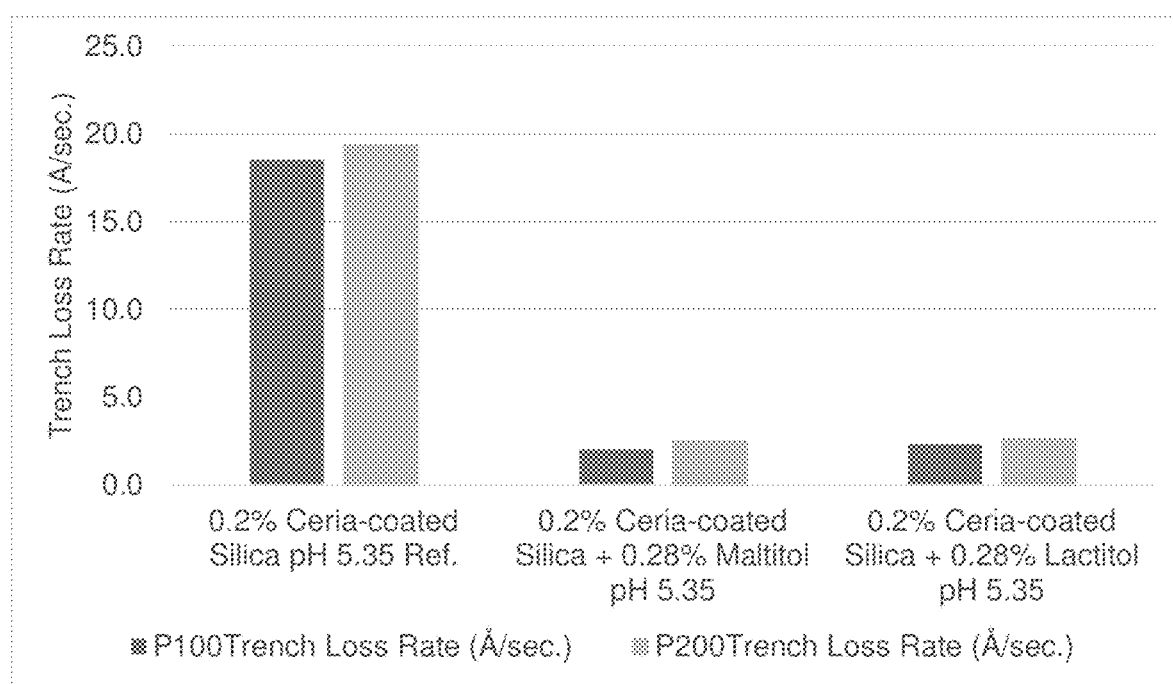
FIG. 4 depicts the effects of Maltitol or Lactitol on Trench Loss Rates (Å/min.)

In Example 3, the trench oxide loss rates were compared for the polishing compositions using reference and working compositions comprising maltitol or lactitol The results were listed in Table 5 and depicted in FIG. 4.

TABLE 5

Effects of Maltitol or Lactitol on Trench Loss Rates (Å/min.)

| Compositions | P100Trench Loss Rate (Å/sec.) | P200Trench Loss Rate (Å/sec.) |
|---|---|---|
| 0.2% Ceria-coated Silica pH 5.35 Ref. | 18.5 | 19.3 |
| 0.2% Ceria-coated Silica + 0.28% Maltitol pH 5.35 | 2.0 | 2.5 |
| 0.2% Ceria-coated Silica + 0.28% Lactitol pH 5.35 | 2.3 | 2.6 |

As the results shown in Table 4 and FIG. 4, the addition of maltitol or lactitol as oxide trench dishing reducing agent into the polishing compositions, the trench loss rates were significantly reduced vs the reference sample without using such chemical additives.

Example 4

The compositions were prepared as shown in Table 6. The reference composition did not use any chemical additives. The working compositions comprised 0.2 wt. % ceria-coated silica as abrasives, 0.28 wt. % lactitol as chemical additive, biocide, DI water, and a pH adjusting agent to provide different pH conditions.

The removal rates (RR at Å/min) for different films were tested. The effects of pH conditions on the film removal rates and selectivity were observed.

Figure 5:
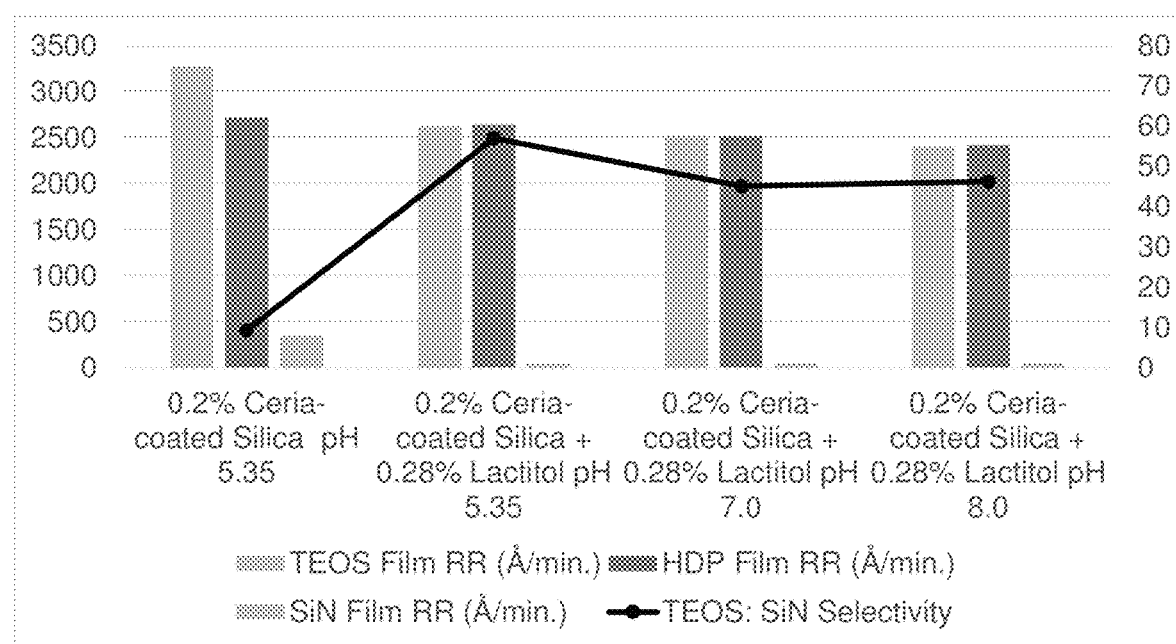
FIG. 5 depicts the effects of pH on Film RR (Å/min) & Selectivity of Oxide:SiN

The test results were listed in Table 6 and shown in FIG. 5.

As the results shown in Table 6 and FIG. 5, the working compositions having lactitol as oxide trench dishing reducing agent provided similar high TEOS and HDP film removal rates, and similarly suppressed SiN film removal rates at three different pH conditions: acidic, neutral and alkaline. High TEOS:SiN selectivity were also maintained.

TABLE 6

Effects of pH on Film RR (Å/min) & Selectivity of Oxide:SiN

| Compositions | TEOS Film RR (Å/min.) | HDP Film RR (Å/min.) | SiN Film RR (Å/min.) | TEOS:SiN Selectivity |
|---|---|---|---|---|
| 0.2% Ceria-coated Silica pH 5.35 | 3279 | 2718 | 349 | 9.4 |
| 0.2% Ceria-coated Silica + 0.28% Lactitol pH 5.35 | 2623 | 2639 | 46 | 57.0 |
| 0.2% Ceria-coated Silica + 0.28% Lactitol pH 7.0 | 2524 | 2517 | 56 | 45.1 |
| 0.2% Ceria-coated Silica + 0.28% Lactitol pH 8.0 | 2401 | 2417 | 52 | 46.2 |

As the results shown in Table 6 and FIG. 5, the working compositions having lactitol as oxide trench dishing reducing agent provided similar high TEOS and HDP film removal rates, and similarly suppressed SiN film removal rates at three different pH conditions: acidic, neutral and alkaline. High TEOS:SiN selectivity were also maintained.

Oxide trenching dishing using compositions without/or with lactitol as chemical additive over polishing times were also tested.

The effects of lactitol containing polishing composition at different pH conditions on the oxide trenching dishing vs over polishing times were observed.

Figure 6:
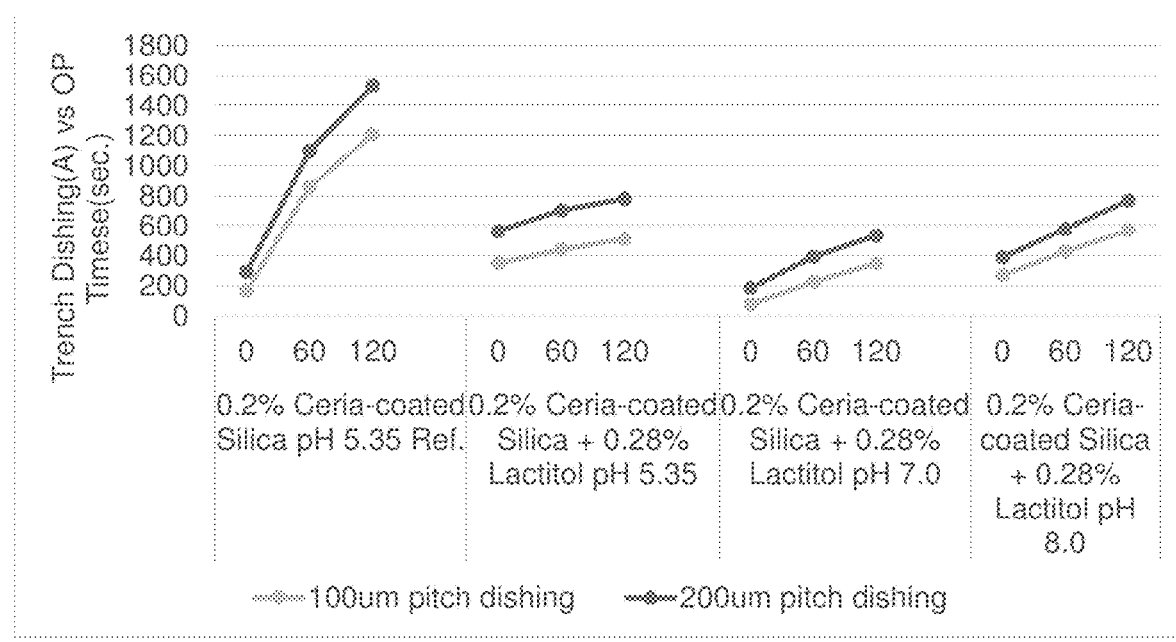
FIG. 6 depicts the effects of lactitol at different pH Conditions on Oxide Trench Dishing vs over polishing (OP) times (Sec.)

The test results were listed in Table 7 and shown in FIG. 6.

As the results shown in Table 7 and FIG. 6, the polishing compositions with the chemical additive lactitol, provided low oxide trench dishing on 100 um pitch, and 200 um pitch respectively when 60 second or 120 second over polishing times were applied at three different tested pH conditions The compositions with lactitol as oxide trench dishing reducing agent provided significant oxide trench dishing reductions comparing to the reference polishing composition which did not use the chemical additive, lactitol.

TABLE 7

Effects of Lactitol at Different pH Conditions on Oxide Trench Dishing vs OP Times (Sec.)

| Compositions | OP Times (Sec.) | 100 um pitch dishing | 200 um pitch dishing |
|---|---|---|---|
| 0.2% Ceria-coated Silica pH 5.35 Ref. | 0 | 165 | 291 |
|  | 60 | 857 | 1096 |
|  | 120 | 1207 | 1531 |
| 0.2% Ceria-coated Silica + 0.28% Lactitol pH 5.35 | 0 | 349 | 563 |
|  | 60 | 438 | 702 |
|  | 120 | 510 | 779 |
| 0.2% Ceria-coated Silica + 0.28% Lactitol pH 7.0 | 0 | 73 | 182 |
|  | 60 | 222 | 390 |
|  | 120 | 346 | 532 |
| 0.2% Ceria-coated Silica + 0.28% Lactitol pH 8.0 | 0 | 269 | 386 |
|  | 60 | 425 | 576 |
|  | 120 | 568 | 766 |

The Ratio of oxide Trench Dishing Rate (Å/min.) vs Blanket HDP film RR (Å/min.) at different pH was listed in Table 8.

As the results shown in Table 8, the addition of lactitol as oxide trench dishing reducer in polishing composition significantly reduced the ratio of trench dishing rate vs the blanket HDP film removal rates at different pH conditions than that ratio obtained for reference sample at pH 5.35.

TABLE 8

| Compositions | P100 Dishing Rate (Å/min.)/Blanket HDP RR (Å/min.) | P200 Dishing Rate (Å/min.)/Blanket HDP RR (Å/min.) |
|---|---|---|
| 0.2% Ceria-coated Silica pH 5.35 | 0.13 | 0.16 |
| 0.2% Ceria-coated Silica + 0.28% Lactitol pH 5.35 | 0.03 | 0.03 |
| 0.2% Ceria-coated Silica + 0.28% Lactitol pH 7.0 | 0.05 | 0.06 |
| 0.2% Ceria-coated Silica + 0.28% Lactitol pH 8.0 | 0.06 | 0.08 |

Figure 7:
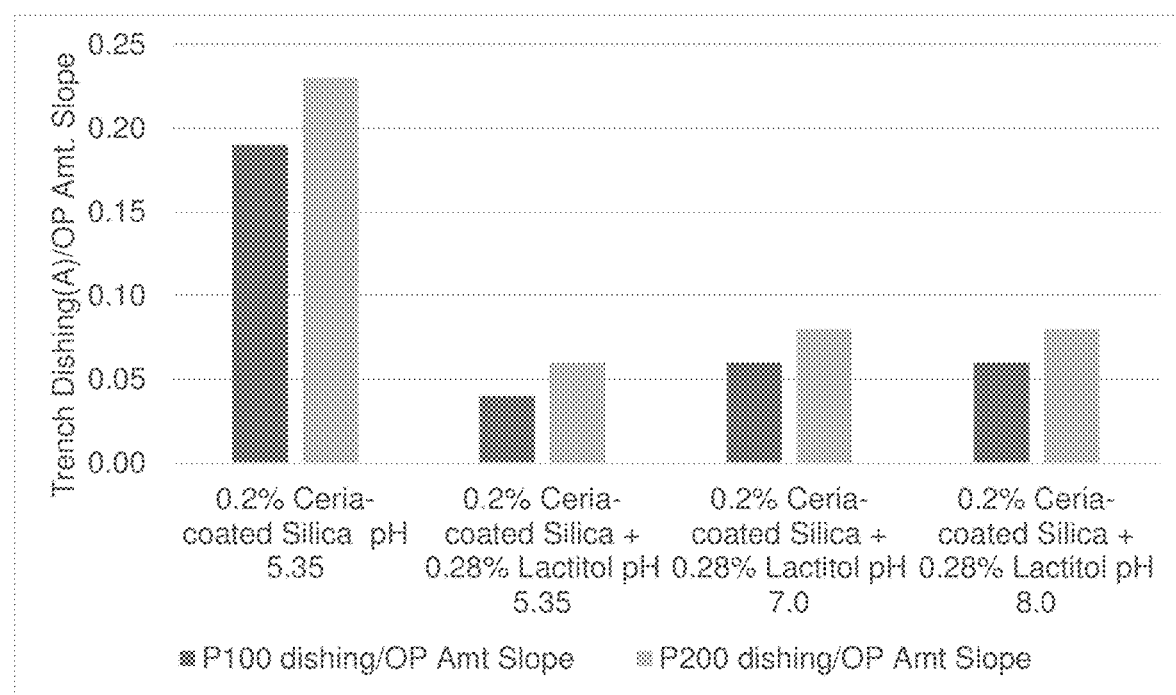
FIG. 7 depicts the effects of lactitol at different pH on Slopes of Dishing vs OP Removal Amount

The slopes of oxide trench dishing vs the OP removal amount was showed in Table 9 and FIG. 7.

TABLE 9

Effects of Lactitol at Different pH on Slopes of Dishing vs OP Removal Amount

| Compositions | P100 dishing/OP Amt Slope | P200 dishing/OP Amt Slope |
|---|---|---|
| 0.2% Ceria-coated Silica pH 5.35 | 0.19 | 0.23 |
| 0.2% Ceria-coated Silica + 0.28% Lactitol pH 5.35 | 0.04 | 0.06 |
| 0.2% Ceria-coated Silica + 0.28% Lactitol pH 7.0 | 0.06 | 0.08 |
| 0.2% Ceria-coated Silica + 0.28% Lactitol pH 8.0 | 0.06 | 0.08 |

The results listed in Table 9 and FIG. 7 indicated that the compositions with chemical additive lactitol provided lower slopes of trench dishing vs the over polishing removal amounts which indicated good over polishing window for maintaining low oxide trench dishing even more oxide film removed in over polishing steps at all three tested pH conditions.

The trench oxide loss rates were compared between the polishing compositions using lactitol (at different pH conditions) and the reference without using lactitol at pH 5.35.

Figure 8:
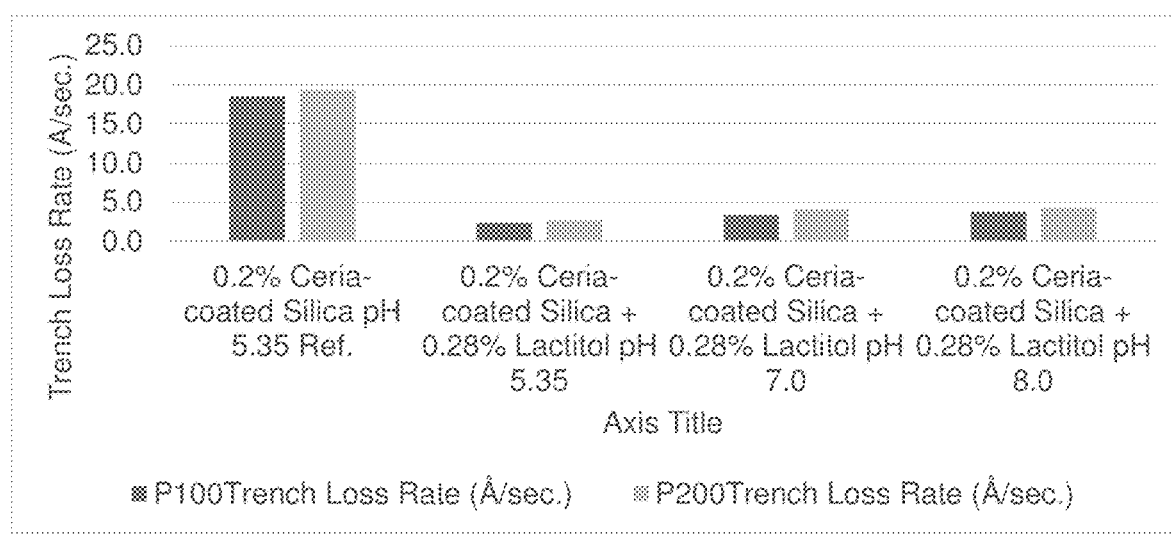
FIG. 8 depicts the of lactitol at different pH conditions on Trench Loss Rates (Å/min.)

The results were listed in Table 10 and depicted in FIG. 8.

As the results shown in Table 10 and FIG. 8, the trench loss rates were significantly reduced for the polishing compositions comprising lactitol at different pH conditions comparing with the reference sample without using lactitol.

The polishing test results obtained at different pH conditions indicates that the disclosed CMP polishing compositions comprising the chemical additives can be used for wide pH range; for acidic, neutral or alkaline pH conditions.

TABLE 10

Effects of Lactitol at Different pH Conditions on Trench Loss Rates (Å/min.)

| Compositions | P100Trench Loss Rate (Å/sec.) | P200Trench Loss Rate (Å/sec.) |
|---|---|---|
| 0.2% Ceria-coated Silica pH 5.35 Ref. | 18.5 | 19.3 |
| 0.2% Ceria-coated Silica + 0.28% Lactitol pH 5.35 | 2.3 | 2.6 |
| 0.2% Ceria-coated Silica + 0.28% Lactitol pH 7.0 | 3.3 | 4.0 |
| 0.2% Ceria-coated Silica + 0.28% Lactitol pH 8.0 | 3.7 | 4.2 |

Example 5

In this example, the stability of ceria-coated silica abrasive particles in the compositions having chemical additives was monitored by measuring the change of the mean particles size and the change of particle size distribution D99.

The reference composition was prepared using 0.2 wt. % ceria-coated silica abrasive and very low concentration of biocide, and pH was adjusted to 5.35.

The working compositions were made using 0.2 wt. % or other wt. % ceria-coated silica abrasive, very low concentration of biocide, and varied concentrations of maltitol or lactitol as oxide trench dishing reducer and with pH adjusted to 5.35.

The abrasive particle stability tests on the polishing compositions were carried out at 50° C. for at least 10 days.

The MPS (nm) and D99 (nm) of the abrasive particles were measured using dynamic light scattering (DLS) technology.

Figure 9:
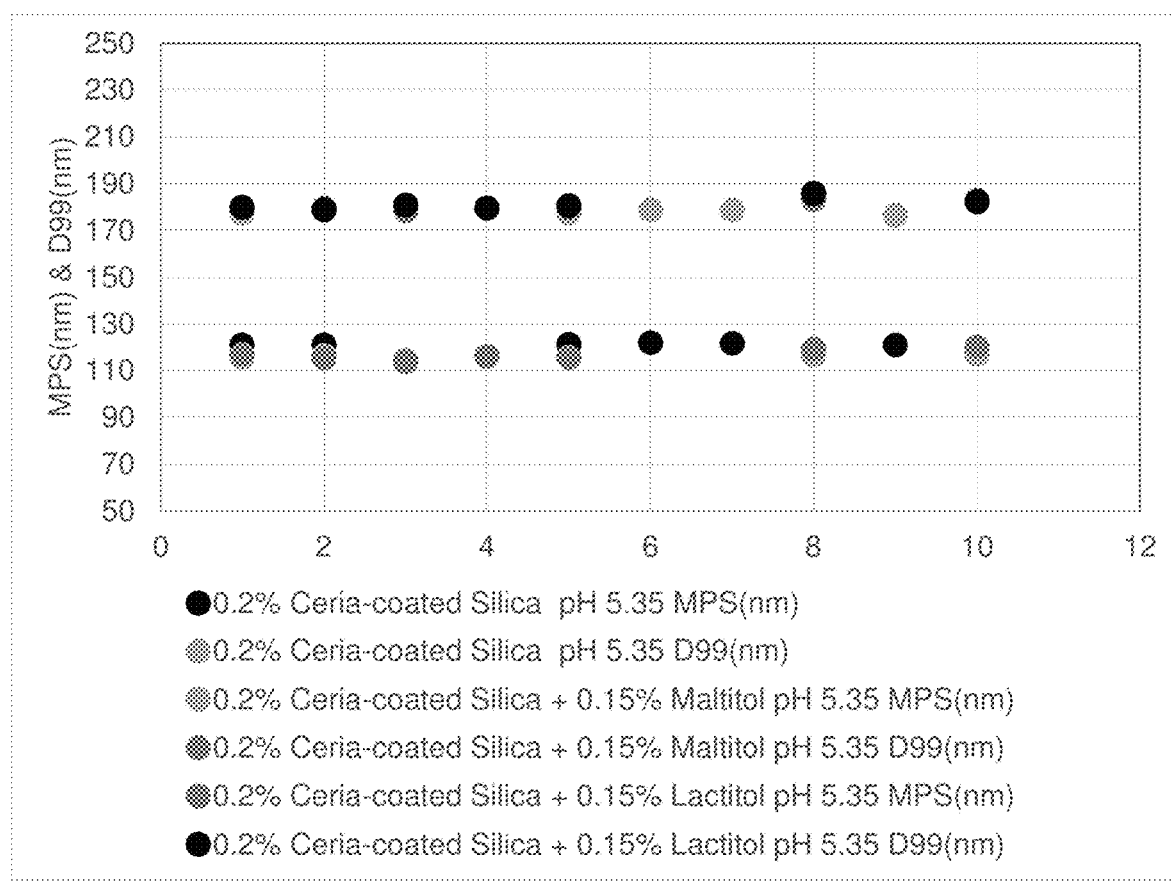
FIG. 9 depicts mean particle size and size distribution stability test Results@50° C.

The stability test results were listed in Table 11 and depicted in FIG. 9.

Data showed that 0.2 wt. % ceria-coated silica particles had a mean particle size changes of less than $8.26 \times 10^{-4}$ and 0.4% by day 22 at 50° C.

Data showed that 0.2 wt. % ceria-coated silica particles had a mean particle size changes of less than $8.26 \times 10^{-4}$ and 0.4% by day 22 at 50° C.

0.2 wt. % of the ceria-coated silica particles had a mean particle size changes of less than 0.1% and 2.7% by day 32 at 50° C. in the composition having 0.15 wt. % of maltitol and 0.15 wt. % lactitol respectively.

TABLE 11

Particle Size Stability Test Results@50° C. - MPS (nm) & D99(nm)

| Compostions | Particle Sizes (nm) | Day 0 | Day 1 | Day 2 | Day 3 | Day 4 | Day 8 | Day 15 | Day 18 | Day 22 | Day 32 |
|---|---|---|---|---|---|---|---|---|---|---|---|
| 0.2% Ceria-coated Silica pH 5.35 | MPS(nm) | 121.1 | 121.1 | | | 121.4 | 122.0 | 121.8 | | 121.0 | |
| | D99(nm) | 177.4 | 179.6 | | | 177.6 | 178.8 | 178.8 | | 176.7 | |
| 0.2% Ceria-coated Silica + 0.15% Maltitol pH 5.35 | MPS(nm) | 115.8 | 116.6 | 114.5 | 116.3 | 115.9 | | | 116.7 | | 116.9 |
| | D99(nm) | 179.6 | 179.6 | 178.4 | 179.6 | 180.0 | | | 183.2 | | 182.8 |
| 0.2% Ceria-coated Silica + 0.15% Lactitol pH 5.35 | MPS(nm) | 117.2 | 115.5 | 113.8 | 116.2 | 115.6 | | | 119.4 | | 120.3 |
| | D99(nm) | 180.0 | 178.8 | 178.4 | 180.9 | 180.6 | | | 185.9 | | 182.3 |

Data also showed that 0.2 wt. % of the ceria-coated silica particles had a D99 changes of less than 1.8% and 1.3% by day 32 at 50° C. in the composition having 0.15 wt. % of maltitol and 0.15 wt. % lactitol respectively.

Additional stability tests were performed using abrasive particles with different MPS (120 nm) and were performed longer (day 62) using compositions comprising maltitol. The results were listed in Table 12 and depicted in FIG. 10.

TABLE 12

Particle Size Stability Test Results@50° C. - MPS (nm) & D99(nm)

| Compositions | Particle Sizes (nm) | Day 0 | Day 1 | Day 4 | Day 8 | Day 15 | Day 22 | Day 33 | Day 40 | Day 62 |
|---|---|---|---|---|---|---|---|---|---|---|
| 0.2% Ceria-coated Silica + 0.15% Maltitol pH 5.35 | MPS(nm) | 120 | 121.1 | 122.8 | 123 | 123.2 | 121.5 | 121.9 | 120.6 | 119.9 |
| | D99(nm) | 176.3 | 178 | 180.9 | 180.4 | 180 | 172.4 | 178.3 | 176.2 | 177.4 |

Data also showed that 0.2 wt. % of the ceria-coated silica particles had MPS and D99 changes of less than $8.5 \times 10^{-4}$ and less than 0.63% by day 62 at 50° C. respectively.

Furthermore, the particle stability tests were also conducted at 50° C. on polishing compositions comprised more concentrated ceria-coated silica abrasives more than 0.2 wt. %) and more concentrated maltitol (more than 0.15 wt. %) as oxide trench dishing reducer.

Figure 11:
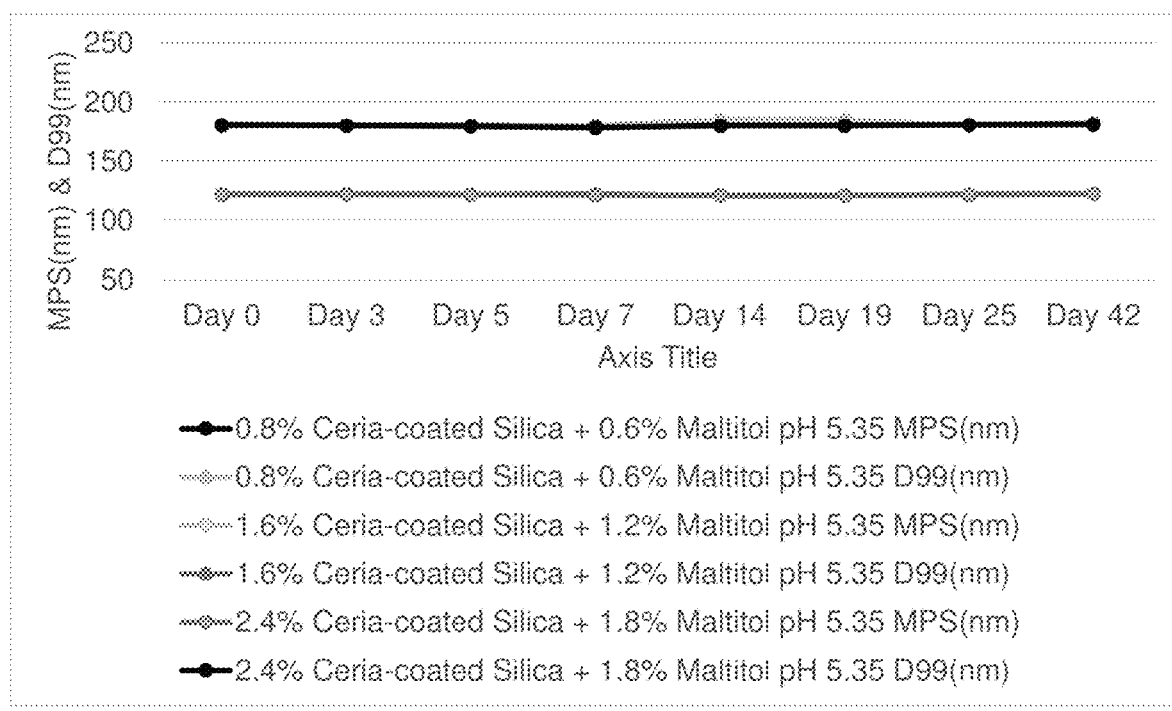
FIG. 11 depicts mean particle size and size distribution stability test Results@50° C.

The test results were listed in Table 13 and depicted in FIG. 11.

Data also showed that 0.8 wt. % of the ceria-coated silica particles had MPS and D99 changes of less than 0.41% and less than 0.23% respectively by day 42 at 50° C. in the composition having 0.6 wt. % of maltitol respectively.

TABLE 13

Particle Size Stability Test Results@50° C. - MPS (nm) & D99(nm)

| Compositions | Particle Sizes (nm) | Day 0 | Day 3 | Day 5 | Day 7 | Day 14 | Day 19 | Day 25 | Day 42 |
|---|---|---|---|---|---|---|---|---|---|
| 0.8% Ceria-coated Silica + | MPS(nm) | 122 | 122 | 121.9 | 122 | 121 | 121 | 121.4 | 122.5 |
| 0.6% Maltitol pH 5.35 | D99(nm) | 180.5 | 179.5 | 180 | 179.6 | 185.3 | 185.3 | 179.6 | 180.9 |
| 1.6% Ceria-coated Silica + | MPS(nm) | 121.2 | 122.1 | 122.1 | 121.5 | 121.3 | 121.2 | 121.4 | 122.6 |
| 1.2% Maltitol pH 5.35 | D99(nm) | 179.5 | 180 | 180 | 179.2 | 179.6 | 179.6 | 180.5 | 182.3 |
| 2.4% Ceria-coated Silica + | MPS(nm) | 122.1 | 121.9 | 121.5 | 121.1 | 121 | 121 | 122 | 122.5 |
| 1.8% Maltitol pH 5.35 | D99(nm) | 180.5 | 180 | 179.2 | 178 | 180.1 | 180.1 | 180.5 | 180.9 |

1.6 wt. % of the ceria-coated silica particles had MPS and D99 changes of less than 1.2% and less than 1.6% respectively by day 42 at 50° C. in the composition having 1.2 wt. % of maltitol respectively.

2.4 wt. % of the ceria-coated silica particles had MPS and D99 changes of less than 0.33% and less than 0.23% respectively by day 42 at 50° C. in the composition having 1.8 wt. % of maltitol respectively.

Figure 10:
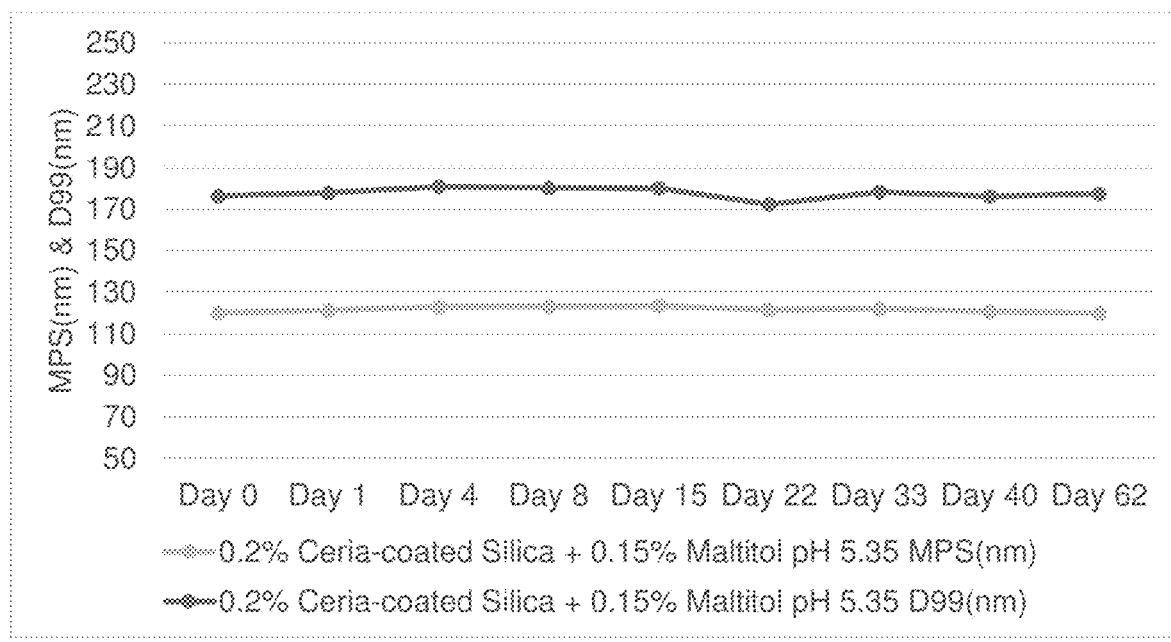
FIG. 10 depicts mean particle size and size distribution stability test Results@50° C.

As the results shown in Table 9, 10, and 11 and FIGS. 9, 10 and 11, when maltitol or lactitol used as oxide trench dishing reducer with ceria-coated silica particles as abrasives, the polishing compositions showed very good abrasive particle size stability as the changes of particle MPS (nm) and particle size distribution D99 (nm) were less than 1.8% and less than 2.7% respectively even at elevated testing temperatures.

Thus, the abrasive particles were stable in the disclosed CMP polishing compositions.

Example 6

The following three polishing compositions were prepared for defect count testing.

The first sample was prepared using 0.5 wt. % calcinated ceria abrasives, 0.05 wt. % polyacrylate salt and low concentration of biocide. The first sample was picked since it is a known polishing CMP composition comprised of calcinated ceria abrasives and polyacrylate salt as chemical additive for dispersing and trench dishing reducer.

The second sample was prepared using 0.2 wt. % ceria-coated silica abrasives, 0.28 wt. % maltitol and low concentration of biocide; the third sample was prepared using 0.2 wt. % ceria-coated silica abrasives, 0.28 wt. % lactitol and low concentration of biocide; all three formulations have pH valued at 5.35.

In order to obtain similar dielectric film removal rates used for comparison, higher concentration of calcinated ceria abrasive was used in sample 1.

The total defect counts on polished TEOS and SiN wafers were compared by using three afore listed polishing compositions. The total defect count results were listed in Table 14 and depicted in FIG. 12.

TABLE 14

Effects of Different Polishing Compositions on TEOS & SiN Total Defect Counts

| Compositions | TEOS Total Defect Count@0.13 μm LPD | SiN Total Defect Count@0.13 μm LPD |
|---|---|---|
| 0.5% Calcinated Ceria + 0.05% Polyacrylate Salt pH | 3847 | 498 |
| 0.2% Ceria-coated Silica + 0.28% Maltitol pH 5.35 | 438 | 73 |
| 0.2% Ceria-coated Silica + 0.28% Lactitol pH 5.35 | 493 | 73 |

Figure 12:
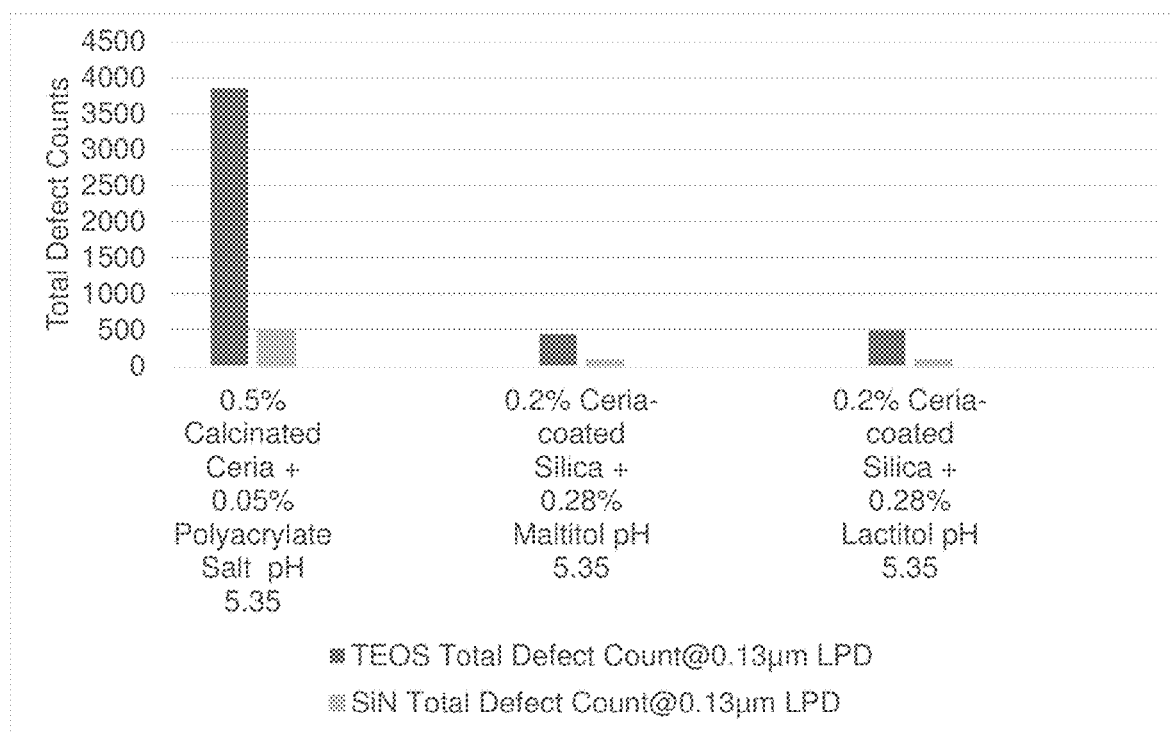
FIG. 12 depicts the effect of different polishing compositions on TEOS & SiN total defect counts

As the total defect count results shown in Table 12 and FIG. 12, the polishing compositions using ceria-coated silica particles as abrasives and either maltitol or lactitol as trench dishing reducing agent afforded significantly lower total defect counts on the polished TEOS and SiN wafers than the total defect counts obtained using a well-known polishing composition comprised of calcinated ceria abrasives and polyacrylate salt as chemical additive.

Thus, the CMP polishing compositions in the present invention provide reduced total defect counts through and post-polishing.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A Chemical Mechanical Polishing (CMP) composition comprising:
   abrasive particles selected from the group consisting of
      ceria-coated inorganic metal oxide particles selected from the group consisting of ceria-coated colloidal silica, ceria-coated high purity colloidal silica, ceria-coated alumina, ceria-coated titania, ceria-coated zirconia particles and combinations thereof;
ceria-coated organic polymer particles selected from the group consisting of ceria-coated polystyrene particles, ceria-coated polyurethane particle, ceria-coated polyacrylate particles, and combinations thereof; and
combinations thereof;
chemical additive having a range from 0.05 wt. % to 5 wt. %;
solvent selected from the group consisting of deionized (DI) water, distilled water, and alcoholic organic solvents; and
optionally
biocide; and
pH adjuster;
wherein
the composition has a pH of 3 to 10;
mean particles size of the ceria-coated inorganic oxide particles is from 115.8 nm to 500 nm;
the abrasive particles have changes of mean particle size MPS (nm) and D99 (nm)≤3.0% over shelf time of ≥30 days at a temperature ranging from 20 to 60° C.;
wherein D99 (nm) is a particle size that 99 wt. % of the particles fall on and under;
and
the chemical additive has at least four hydroxyl functional groups in its molecular structure as shown in (a)

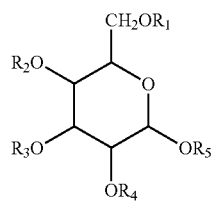

(a)

wherein R1, R2, R3, R4 and R5 (Rs in group of R1 to R5) are selected as following
(i) at least one R in the group of R1 to R5 is a polyol molecular unit having a structure shown in (b):

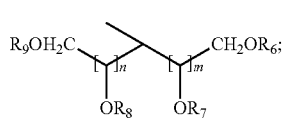

(b)

wherein m or n is independently selected from 1 to 5; and each of R6, R7, R8 and R9 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof;
and
(ii) each of other Rs in the group of R1 to R5 is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof.

2. The Chemical Mechanical Polishing (CMP) composition of claim 1, wherein the chemical additive has at least fix hydroxyl functional groups in its molecular structure.

3. The Chemical Mechanical Polishing (CMP) composition of claim 1, wherein the polyol molecular unit (b) has n=2 and m=1; and rest of Rs in the group of R1 to R9 are all hydrogen atoms, as shown below:

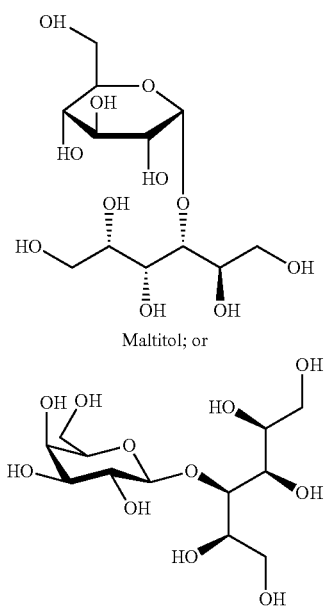

the solvent is deionized (DI) water; and
the ceria-coated colloidal silica particles have changes of mean particle size MPS (nm) and D99 (nm)≤2.0%.

4. The chemical mechanical polishing composition of claim 1, wherein the composition comprises ceria-coated colloidal silica particles; the chemical additive is selected from the group consisting of maltitol, lactitol, maltotritol and combinations thereof; and water.

5. The chemical mechanical polishing composition of claim 1, wherein the composition comprises at least one selected from the group consisting of from 0.0001 wt. % to 0.05 wt. % of the biocide having active ingredient selected from the group consisting of 5-chloro-2-methyl-4-isothiazolin-3-one, 2-methyl-1-isothiazolin-3-one, and combinations thereof; from 0 wt. % to 1 wt. % of the pH adjusting agent selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions; and combinations thereof.

* * * * *